United States Patent [19]

Fujito

[11] Patent Number: 4,996,482
[45] Date of Patent: Feb. 26, 1991

[54] CAPACITOR STICK FOR NMR PROBE

[75] Inventor: Teruaki Fujito, Tokyo, Japan

[73] Assignee: JEOL Ltd., Tokyo, Japan

[21] Appl. No.: 410,092

[22] Filed: Sep. 20, 1989

[30] Foreign Application Priority Data

Sep. 22, 1988 [JP] Japan .......................... 63-124247[U]

[51] Int. Cl.⁵ .............................................. G01R 33/20
[52] U.S. Cl. ...................................... 324/318; 324/322
[58] Field of Search ............... 324/300, 307, 318, 322

[56] References Cited

U.S. PATENT DOCUMENTS

| | | | |
|---|---|---|---|
| 3,388,322 | 6/1968 | Anderson et al. | 324/5 |
| 4,641,097 | 2/1987 | Bottomley | 324/318 |
| 4,710,719 | 12/1987 | Doty | 324/322 |
| 4,737,715 | 4/1988 | Ikeda | 324/318 |
| 4,739,271 | 4/1988 | Haase | 324/322 |
| 4,742,304 | 5/1988 | Schnall | 324/322 |
| 4,755,756 | 7/1988 | Nishihara | 324/322 |
| 4,837,515 | 6/1989 | Nishihara | 324/318 |

OTHER PUBLICATIONS

"A Multinuclear Double-Tuned Probe for Applications with Solids or Liquids Utilizing Lumped Tuning Elements," F. David Dody, Ruth R. Inners, and Paul D. Ellis, *Journal of Magnetic Resonance 43, 399–416, (1981)*.

Primary Examiner—Michael J. Tokar
Attorney, Agent, or Firm—Webb, Burden, Ziesenheim & Webb

[57] ABSTRACT

A capacitor stick having a base electrode on whose tip is installed a chip capacitor is disclosed. The chip capacitor is insulated from the base electrode. A compensating coil is inserted between the base electrode and chip capacitor, and a series resonant circuit regarding a decoupling high frequency is composed of the chip capacitor and compensating coil.

2 Claims, 2 Drawing Sheets

CAPACITOR STICK FOR NMR PROBE

BACKGROUND OF THE INVENTION

This invention relates to an NMR probe used for the nuclear magnetic resonance spectrometer, and especially to a capacitor stick that constitutes a part of a tuning circuit installed in the NMR probe.

In the nuclear magnetic resonance spectrometer, the NMR probe is arranged in a static magnetic field caused by a large magnet. In this NMR probe are arranged a sample inserted from outside, a sample coil to be arranged near the sample, and a capacitor which is combined with this sample coil to constitute the tuning circuit. An example of this type of tuning circuit is disclosed by U.S. Pat. No. 3,388,322.

The tuning frequency of this tuning circuit can be varied by a variable-capacitance capacitor. However, a variable-capacitance capacitor has a narrow variation range. Therefore, when changing the tuning frequency for a reason such as changing the observation nucleus, the capacitor itself is replaced.

FIG. 1 shows a conventional double-resonance probe circuit for solid NMR. The basic design of this type of circuit is proposed by F. D. Doty et al. (JOURNAL OF MAGNETIC RESONANCE 43. 399–416 (1981)). In FIG. 1, sample coil 1 is placed near the periphery of the sample. This sample coil 1 is supplied with a high-frequency observation signal having the resonance frequency $f_0$ (e.g., 100 MHz) of the observation nucleus (e.g., carbon nucleus), from the observation side input-/output terminal 2.

On the other hand, sample coil 1 is supplied with a high frequency having the resonance frequency $f_1$ (e.g., 400 MHz) of the decoupling nucleus (e.g., hydrogen nucleus), from the irradiation side input terminal 3. Matching capacitor 4 and capacitor stick 5 work together with capacitor 6 as a tuning capacitor regarding observation frequency $f_0$.

This capacitor stick, as shown in FIG. 2, is composed of a stick S whose tip is fitted with a base electrode Eb on which is mounted chip capacitor C. When installed in the circuit, an upper electrode 16 of the chip capacitor comes in contact with a receiving electrode 17 on the circuit side, and the base electrode Eb is grounded. The capacitor stick is replaced with another stick having a capacitor differing in capacitance depending on the observation nucleus. Variable capacitor 6' works as a tuning capacitor regarding the decoupling frequency $f_1$.

To one end, A of the sample coil 1 is connected a ¼ wavelength cable 7, which has ¼ the wavelength λ of the high frequency for decoupling. To the other end, B, is connected to a trap circuit 10 consisting of a coil 8 and a cable 9 whose total effective wavelength is λ/4.

FIG. 3(a) shows an equivalent circuit regarding the frequency $f_0$ of the circuit in FIG. 1. On the other hand, since the cable 7 and the circuit 10 have extremely high (ideally infinite) and extremely low (ideally zero) impedance, respectively, with regard to frequency $f_1$, the equivalent circuit regarding frequency $f_1$ of the circuit in FIG. 1 becomes as shown in FIG. 3(b). Since the end B of sample coil 1 is grounded by trap 10 with regard to frequency $f_1$, the decoupling high-frequency signal of frequency $f_1$ can be prevented from leaking to the observation side input/output terminal.

To avoid the resonance in the operating range, the above-mentioned capacitor stick employs a chip capacitor with an extremely small lead inductance, such as shown in FIG. 2. Even in such a chip capacitor, the self-inductance is not perfectly zero. When presented as an equivalent circuit, it forms a parallel resonant circuit such as shown in FIG. 4, and has a self-resonance frequency which lowers as the capacitance of the chip capacitor becomes larger. A commercial chip capacitor with a capacitance of 20 PF has a resonance frequency of about 820 MHz. One with a 60 PF capacitance has a 400 MHz resonance frequency. When the chip capacitor with 60 PF is used, trap 10 shows an impedance of zero with regard to a 400 MHz frequency in the circuit in FIG. 1, whereas the capacitor stick shows an infinite impedance. As a result, the impedance between point B and ground rises, the decoupling high frequency of 400 MHz leaks to the observation input/output terminal side, thus causing noise.

SUMMARY OF THE INVENTION

It is an object of the present invention to provide a capacitor stick that can eliminate the influence of the resonance based on the self-inductance of the chip capacitor, thus allowing the prevention of the leakage of decoupling high frequency to the observation input-/output terminal.

According to the present invention, a chip capacitor is insulated from a base electrode and a compensating coil is provided between the tip of the base electrode and the chip capacitor; and the capacitance of the chip capacitor and the inductance of the compensating coil are properly selected so that a series resonant circuit regarding the decoupling high frequency may be composed of this chip capacitor and the compensating coil.

Other objects and features of the invention will appear in the course of the description thereof which follows.

DESCRIPTION OF THE PREFERRED EMBODIMENT

Figure 5:
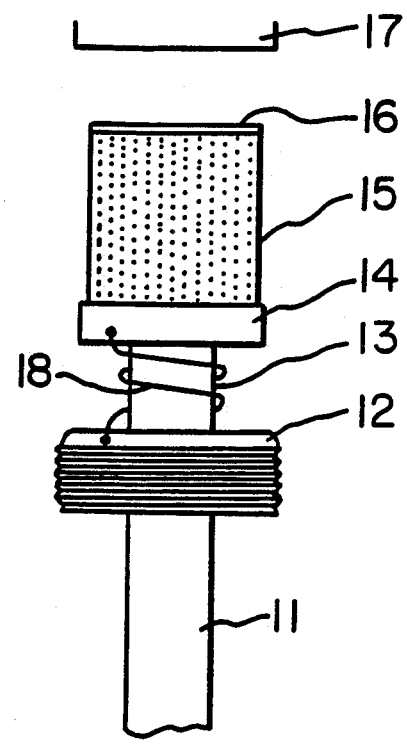
FIG. 5 shows an example of a capacitor stick based on the present invention.

FIG. 5 shows an example of a capacitor stick based on the present invention. In FIG. 5, a lower base electrode 12 is fitted to the tip of stick electrode 11 and an upper base electrode 14 is installed so that an insulating rod 13 is sandwiched between the two base electrodes. To the upper base electrode, one of the electrodes on chip capacitor 15 is soldered. The upper base electrode 14 and the lower base electrode 12 are connected by a compensating coil 18.

Figure 1:
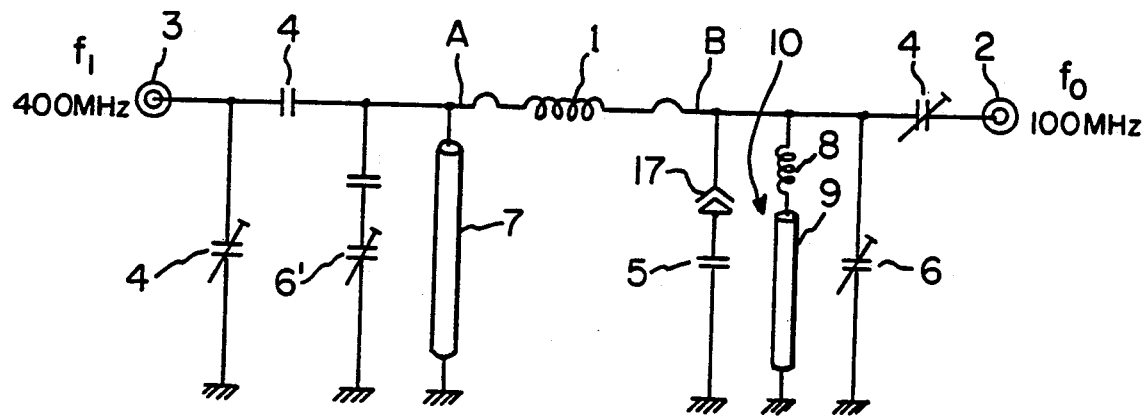
FIG. 1 shows a conventional circuit used for a double resonance probe for solid NMR.
Figure 2:
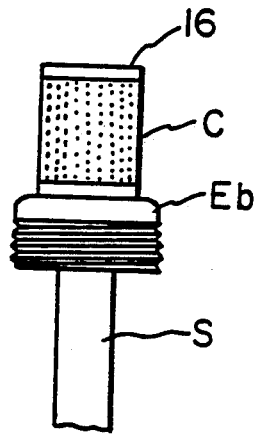
FIG. 2 shows a conventional capacitor stick.
Figure 3A:
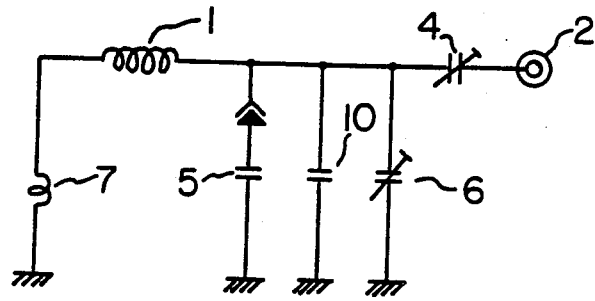
FIG. 3(a) shows an equivalent circuit regarding the frequency of $f_0$ of the circuit shown in FIG. 1.
Figure 3B:
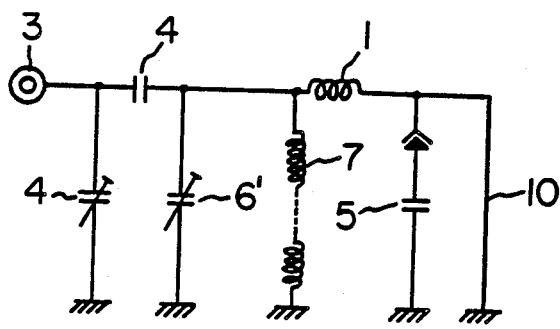
FIG. 3(b) shows an equivalent circuit regarding the frequency $f_1$ of the circuit shown in FIG. 1.

When the capacitor stick with the above-mentioned structure is inserted into the circuit in FIG. 1, the other electrode 16, on chip capacitor 15 comes into contact with the receiving electrode 17 in the circuit side and the lower base electrode 12 is grounded.

Figure 4:
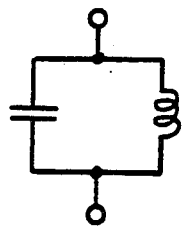
FIG. 4 shows an equivalent circuit of a capacitor.
Figure 6:
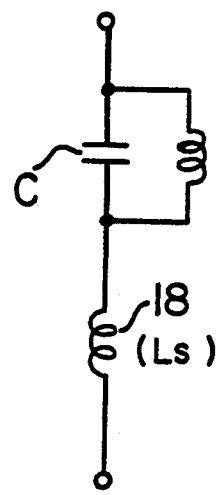
FIG. 6 shows an equivalent circuit of the capacitor stick based on the present invention.

FIG. 6 shows an equivalent circuit of the capacitor stick. It is known from the figure that the compensating coil 18 is connected in series to the equivalent circuit shown in FIG. 4. The inductance Ls of the compensating coil and the capacitance C of the chip capacitor are set so that series resonance is caused at the decoupling frequency $f_1$.

By so setting, the impedance of the capacitor stick regarding the coupling frequency $f_1$ is made zero by series resonance. Therefore, if the capacitor stick is used in the circuit shown in FIG. 1, point B is grounded with regard to the frequency $f_1$ both by the trap circuit 10 and by the capacitor stick. Accordingly, it is possible to completely prevent the leakage of the decoupling high-frequency signal of frequency $f_1$ to the observation side input/output terminal 2.

Having thus described my invention with the detail and particularity required by the Patent Laws, what is claimed and desired to be protected by Letters Patent is set forth in the following claims:

1. In a sample coil arrangement for a nuclear magnetic resonance device with a capacitor stock arranged adjacent the sample and constituting part of the tuning circuit for the observation frequency, the improvement comprising:
   (a) said capacitor stick having a chip capacitor spaced from a base electrode by an insulating means, and
   (b) a compensating coil connecting the base electrode and the chip capacitor, said chip capacitor and compensating coil forming a series resonant circuit such that the resonant frequency corresponds to an NMR decoupling high frequency.

2. A capacitor stick for use in a tuning circuit installed in an NMR probe, comprising:
   a stick member;
   a lower base electrode attached to the end of the stick element;
   an upper base electrode spaced from the lower base electrode by an insulating rod;
   a chip capacitor attached to the upper base electrode; and
   a compensating coil which connects the upper base electrode and the lower base electrode, said compensating coil forming a series resonant circuit regarding the decoupling high frequency in combination with the chip capacitor.

* * * * *

UNITED STATES PATENT AND TRADEMARK OFFICE
CERTIFICATE OF CORRECTION

PATENT NO. : 4,996,482
DATED : February 26, 1991
INVENTOR(S) : Teruaki Fujito

It is certified that error appears in the above-identified patent and that said Letters Patent is hereby corrected as shown below:

Column 1 Line 65 "$f_1$" should read --$f_0$--.

Claim 1 Line 23 Column 3 "stock" should read --stick--.

Signed and Sealed this

Twentieth Day of October, 1992

Attest:

DOUGLAS B. COMER

*Attesting Officer*   *Acting Commissioner of Patents and Trademarks*